(12) United States Patent
Lee

(10) Patent No.: US 10,778,163 B2
(45) Date of Patent: Sep. 15, 2020

(54) AMPLIFICATION CIRCUIT, AND RECEIVING CIRCUIT, SEMICONDUCTOR APPARATUS AND SEMICONDUCTOR SYSTEM USING THE AMPLIFICATION CIRCUIT

(71) Applicant: SK hynix Inc., Incheon-si Gyeonggi-do (KR)

(72) Inventor: Hyun Bae Lee, Icheon-si (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 21 days.

(21) Appl. No.: 16/228,110

(22) Filed: Dec. 20, 2018

(65) Prior Publication Data

US 2020/0021260 A1    Jan. 16, 2020

(30) Foreign Application Priority Data

Jul. 13, 2018   (KR) ........................ 10-2018-0081451

(51) Int. Cl.
| | | |
|---|---|---|
| *H03F 3/45* | (2006.01) | |
| *H03F 3/193* | (2006.01) | |
| *H03G 3/30* | (2006.01) | |
| *H04B 1/04* | (2006.01) | |
| *H04B 1/16* | (2006.01) | |

(52) U.S. Cl.
CPC ......... *H03F 3/45197* (2013.01); *H03F 3/193* (2013.01); *H03G 3/30* (2013.01); *H03F 2200/372* (2013.01); *H03F 2200/378* (2013.01); *H03F 2203/45631* (2013.01); *H03F 2203/45701* (2013.01); *H03G 2201/103* (2013.01); *H04B 1/04* (2013.01); *H04B 1/16* (2013.01)

(58) Field of Classification Search
CPC ............. H03F 3/45; H03F 3/191; H03F 3/193
USPC ........................................ 330/260, 302, 305
See application file for complete search history.

(56) References Cited

U.S. PATENT DOCUMENTS 6,043,710 A * 3/2000 Smith ...................... H03D 7/14
                                                       327/359

FOREIGN PATENT DOCUMENTS

KR           100306828 B1    12/2001

* cited by examiner

*Primary Examiner* — Steven J Mottola
(74) *Attorney, Agent, or Firm* — William Park & Associates Ltd.

(57) ABSTRACT

An amplification circuit configured to generate an output signal by differentially amplifying first and second input signals. The first and second input signals are a differential signal pair. Alternatively, the first input signal is a single-ended signal, and the second input signal is a reference signal. The amplification circuit is configured to perform a differential amplification operation by increasing a gain for generating an output signal based on the first input signal.

24 Claims, 6 Drawing Sheets

US 10,778,163 B2

AMPLIFICATION CIRCUIT, AND RECEIVING CIRCUIT, SEMICONDUCTOR APPARATUS AND SEMICONDUCTOR SYSTEM USING THE AMPLIFICATION CIRCUIT

CROSS-REFERENCES TO RELATED APPLICATION

The present application claims priority under 35 U.S.C. § 119(a) to Korean application number 10-2018-0081451, filed on Jul. 13, 2018, in the Korean Intellectual Property Office, which is incorporated herein by reference in its entirety.

BACKGROUND

1. Technical Field

Various embodiments generally relate to an integrated circuit technology, and more particularly, to a semiconductor apparatus and a semiconductor system.

2. Related Art

An electronic device may include many electronic components. Among the electronic components, a computer system may include a large number of semiconductor apparatuses configured as semiconductors. The semiconductor apparatuses constituting the computer system may communicate with one another while transmitting and receiving clocks and data. Each of the semiconductor apparatuses may include a receiving circuit to receive a signal transmitted from an external device or receive a signal transmitted between internal circuits therein. The receiving circuit may include an amplification circuit to perform a differential amplification operation. The amplification circuit may receive differential signals or a single-ended signal. The amplification circuit uses a reference voltage to receive the single-ended signal. When the amplification circuit receives the differential signals, one input signal has a complementary level of the other input signal. Thus, the amplification circuit may compensate for inter-symbol interference (ISI) caused by a high-frequency loss, reflection and cross-talk of a channel, and increase an AC gain to accurately amplify the signals. However, when the amplification circuit receives the single-ended signal, the voltage level of the single end signal corresponding to one input signal swings, but the reference voltage corresponding to the other input signal retains a predetermined voltage level. Therefore, the common mode of the amplification circuit may drift, or the AC gain may decrease. Thus, there is a demand for an amplification circuit capable of generating an output signal with a constant gain, regardless of the type of an input signal.

SUMMARY

In an embodiment, an amplification circuit may include a load circuit, a first input circuit, a second input circuit, a source resistor, a first capacitor, a second capacitor, and a gain booster. The load circuit may be coupled between a high-voltage rail and first and second output nodes. The first input circuit may be coupled between the first output node and a first common node, and configured to change a voltage level of the first output node based on a first input signal. The second input circuit may be coupled between the second output node and a second common node, and configured to change a voltage level of the second output node based on a second input signal, and output an output signal through the second output node. The source resistor may be coupled between the first and second common nodes. The first capacitor may be coupled between the first common node and a low-voltage rail. The second capacitor may be coupled between the second common node and the low-voltage rail. The gain booster may be configured to receive the first input signal and change a voltage level of the second common node.

In an embodiment, an amplification circuit may include a load circuit, a first input circuit, a second input circuit, a source resistor, a first programmable capacitor, a second programmable capacitor, and a gain booster. The load circuit may be coupled between a high-voltage rail and first and second output nodes. The first input circuit may be coupled between the first output node and a first common node, and configured to change a voltage level of the first output node based on a first input signal. The second input circuit may be coupled between the second output node and a second common node, and configured to change a voltage level of the second output node based on a second input signal, and output an output signal through the second output node. The source resistor may be coupled between the first and second common nodes. The first programmable capacitor may be coupled between the first common node and a low-voltage rail. The second programmable capacitor may be coupled between the second common node and the low-voltage rail. The gain booster may be configured to receive the first input signal and change a voltage level of the second common node.

In an embodiment, an amplification circuit may include a load circuit, a first input circuit, a second input circuit, a source resistor, a capacitor, and a gain booster. The load circuit may be coupled between a high-voltage rail and first and second output nodes. The first input circuit may be coupled between the first output node and a first common node, and configured to change a voltage level of the first output node based on a first input signal. The second input circuit may be coupled between the second output node and a second common node, and configured to change a voltage level of the second output node based on a second input signal, and output an output signal through the second output node. The source resistor may be coupled between the first and second common nodes. The capacitor may be coupled between the first common node and a low-voltage rail. The gain booster may be configured to receive the first input signal and change a voltage level of the second common node.

DETAILED DESCRIPTION

Figure 1:
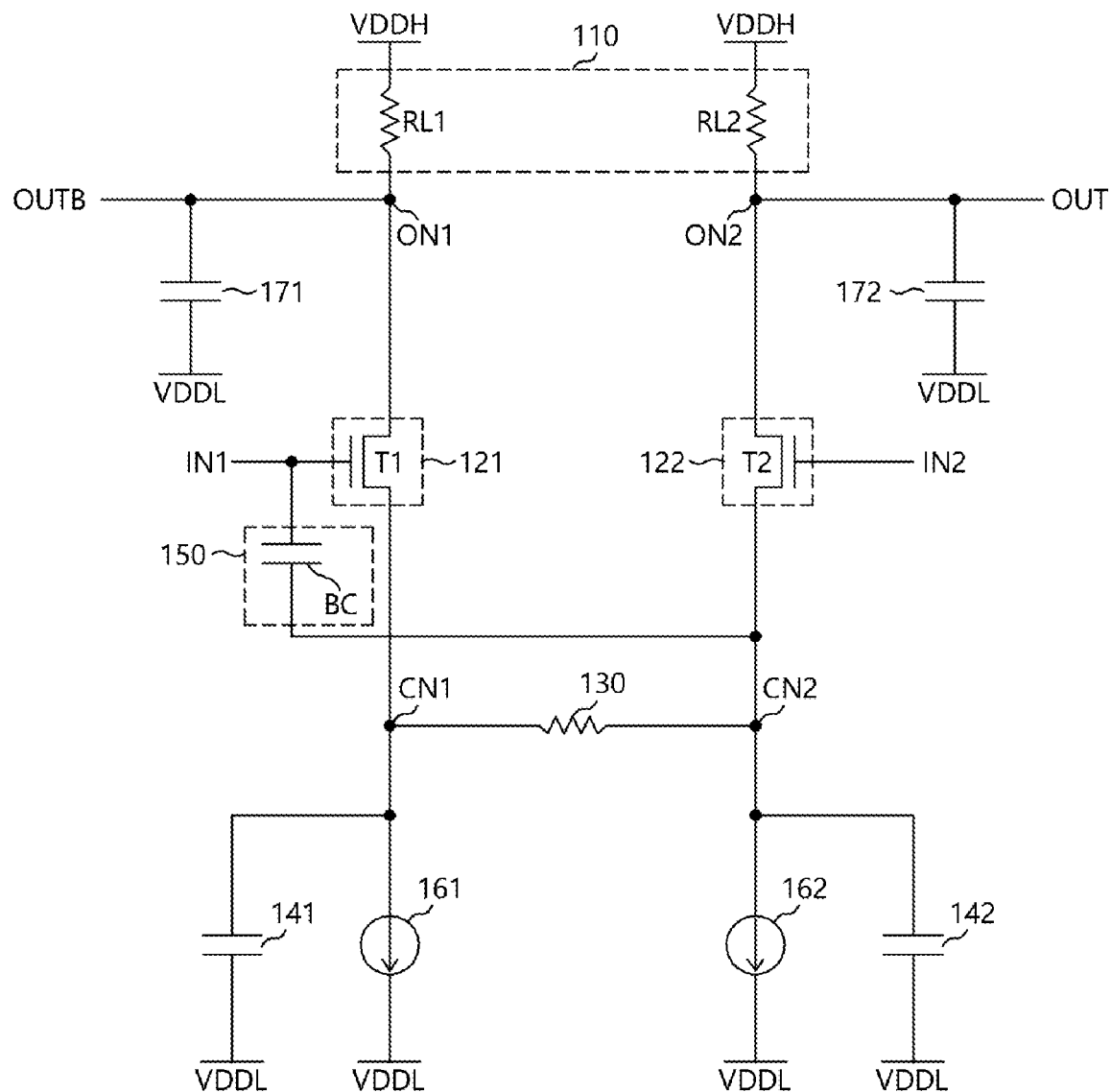
FIG. 1 illustrates the configuration of an amplification circuit in accordance with an embodiment.

FIG. 1 illustrates the configuration of an amplification circuit 100 in accordance with an embodiment. The amplification circuit 100 may receive first and second input signals IN1 and IN2 and generate an output signal OUT. The amplification circuit 100 may generate the output signal OUT by differentially amplifying the first and second input signals IN1 and IN2. The amplification circuit 100 may generate a complementary signal OUTB of the output signal with the output signal OUT. In an embodiment, the first and second input signal IN1 and IN2 may be a differential signal pair. For example, the second input signals IN2 may be a complementary signal which is exactly out of phase with the first input signal IN1. In an embodiment, the first input signal IN1 may be a single-ended signal, and the second input signal IN2 may be a reference voltage. The reference voltage may have a voltage level corresponding to the middle of the range in which the first input signal IN1 swings. The amplification circuit 100 may generate the output signal OUT by differentially amplifying the differential signal pair or the single-ended signal and the reference voltage. In particular, when differentially amplifying the single-ended signal and the reference voltage, the amplification circuit 100 may increase a gain for generating the output signal OUT and perform the differential amplification operation.

In FIG. 1, the amplification circuit 100 may include a load circuit 110, a first input circuit 121, a second input circuit 122, a source resistor 130, a first capacitor 141, a second capacitor 142 and a gain booster 150. The load circuit 110 may be coupled between a high-voltage rail and first and second output nodes ON1 and ON2. Through the high-voltage rail, a high voltage VDDH may be applied to the amplification circuit 100. The high voltage VDDH may serve as a power supply voltage of a semiconductor apparatus including the amplification circuit 100. The load circuit 110 may apply the high voltage VDDH to the first and second output nodes ON1 and ON2.

The first input circuit 121 may be coupled between the first output node ON1 and a first common node CN1. The first common node CN1 may be coupled to a low-voltage rail. Through the low-voltage rail, a low voltage VDDL may be applied to the amplification circuit 100. The low voltage VDDL may have a lower voltage level than the high voltage VDDH. For example, the low voltage VDDL may have a voltage level corresponding to a ground voltage. The first input circuit 121 may receive the first input signal IN1. The first input circuit 121 may change the voltage level of the first output node ON1 based on the first input signal IN1. For example, the first input circuit 121 may change the first output node ON1 to a low level when receiving the high-level first input signal IN1, and change the first output node ON1 to a high level when receiving the low-level first input signal IN1. Through the first output node ON1, the complementary signal OUTB of the output signal may be outputted.

The second input circuit 122 may be coupled between the second output node ON2 and a second common node CN2. The second common node CN2 may be coupled to the low-voltage rail. The second input circuit 122 may receive the second input signal IN2. The second input circuit 122 may change the voltage level of the second output node ON2 based on the second input signal IN2. The second output node ON2 may be changed to the opposite level of the first output node ON1 by the second input circuit 122. Through the second output node ON2, the output signal OUT may be outputted.

The source resistor 130 may be coupled between the first and second common nodes CN1 and CN2. The source resistor 130 may form a current path between the first and second common nodes CN1 and CN2. The source resistor 130 may function as a virtual ground for allowing a current to flow from the first common node CN1 to the second common node CN2 or from the second common node CN2 to the first common node CN1. The source resistor 130 may adjust a gain of the amplification circuit 100. For example, the source resistor 130 may decrease a DC (direct current) gain of the amplification circuit 100, and increase an AC (alternating current) gain of the amplification circuit 100. The DC gain may indicate a gain of the amplification circuit 100 when the first input signal IN1 retains a voltage level in a steady state, and the AC gain may indicate a gain of the amplification circuit 100 when the voltage level of the first input signal IN1 transitions.

The first capacitor 141 may be coupled between the first common node CN1 and the low-voltage rail. The second capacitor 142 may be coupled between the second common node CN2 and the low-voltage rail. The second capacitor 142 may have the same capacitance as the first capacitor 141. The first and second capacitors 141 and 142 may be provided to adjust the AC gain of the amplification circuit 100. In an embodiment, the second capacitor 142 may have different capacitance from the first capacitor 141. In an embodiment, the first and second capacitors 141 and 142 may be configured as programmable capacitors having variable capacitance to adjust the magnitude and/or bandwidth of the AC gain of the amplification circuit 100. The bandwidth of the AC gain may indicate a frequency range in which the amplification circuit can obtain a gain with a predetermined magnitude or more.

The amplification circuit 100 may further include a first current source 161 and a second current source 162. The first current source 161 may be coupled in parallel to the first capacitor 141 between the first common node CN1 and the low-voltage rail. The second current source 162 may be coupled in parallel to the second capacitor 142 between the second common node CN2 and the low-voltage rail. When the first input signal IN1 has a steady-state voltage level, the first and second current sources 161 and 162 may provide current paths from the first and second common nodes CN1 and CN2 to the low-voltage rail, respectively.

The gain booster 150 may receive the first input signal IN1. The gain booster 150 may change the voltage level of the second common node CN2 based on the first input signal IN1. The gain booster 150 may increase the AC gain of the amplification circuit 100 by changing the voltage level of the second common node CN2, when the level of the first input signal IN1 transitions. For example, the gain booster 150 may raise the voltage level of the second common node CN2 when the first input signal IN1 transitions from a low level to a high level. The gain booster 150 may lower the voltage level of the second common node CN2 when the first input signal IN1 transitions from a high level to a low level.

In FIG. 1, the load circuit 110 may include a first load resistor RL1 and a second load resistor RL2. The first load resistor RL1 may be coupled between the high-voltage rail and the first output node ON1. The second load resistor RL2 may be coupled between the high-voltage rail and the second output node ON2. The first load resistor RL1 may have one terminal coupled to the high-voltage rail to receive the high voltage VDDH and the other terminal coupled to the first output node ON1. The second load resistor RL2 may have one terminal coupled to the high-voltage rail to receive the high voltage VDDH and the other terminal coupled to the second output node ON2. The first and second load resistors RL1 and RL2 may have the same resistance value. The first and second load resistors RL1 and RL2 may be configured as programmable resistors having a variable resistance value to adjust the bandwidth of the AC gain of the amplification circuit 100.

The first input circuit 121 may include a first transistor T1. For example, the first transistor T1 may be an N-channel MOS transistor. The first transistor T1 may have a gate configured to receive the first input signal IN1, a drain coupled to the first output node ON1, and a source coupled to the first common node CN1. The second input circuit 122 may include a second transistor T2. For example, the second transistor T2 may be an N-channel MOS transistor. The second transistor T2 may have a gate configured to receive the second input signal IN2, a drain coupled to the second output node ON2, and a source coupled to the second common node CN2.

The gain booster 150 may include a boosting capacitor BC. The boosting capacitor BC may be coupled between the node to which the first input signal IN1 is inputted, that is, the gate of the first transistor T1 and the second common node CN2. The boosting capacitor BC may have one terminal configured to receive the first input signal IN1 and the other terminal coupled to the second common node CN2. The boosting capacitor BC may be configured as a programmable capacitor having variable capacitance.

The amplification circuit 100 may further include a first load capacitor 171 and a second load capacitor 172. The first load capacitor 171 may be coupled to the first output node ON1. The second load capacitor 172 may be coupled to the second output node ON2. The first and second load capacitors 171 and 172 may have the same capacitance. In an embodiment, the first and second load capacitors 171 and 172 may be configured as programmable capacitors having variable capacitance to adjust the bandwidth of the AC gain of the amplification circuit 100. In an embodiment, the first load capacitor 171 may be coupled between the first output node ON1 and the low voltage VDDL. In an embodiment, the second load capacitor 172 may be coupled between the second output node ON2 and the low voltage VDDL.

When the amplification circuit 100 receives the differential signal pair, the second input signal IN2 is a complementary signal of the first input signal IN1. Therefore, the amplification circuit 100 may compensate for a high-frequency loss of a channel, in order to perform an accurate amplification operation. On the other hand, when the amplification circuit 100 receives the single-ended signal, the second input signal IN2 is the reference voltage of which the level does not change. Therefore, the AC gain of the amplification circuit 100 may be decrease to make it difficult to compensate for a high-frequency loss of a channel. Thus, when the level of the first input signal IN1 changes, the gain booster 150 may form a peak of the output signal OUT by changing the voltage level of the second common node CN2, based on the first input signal IN1, thereby increasing the AC gain of the amplification circuit 100.

When the first input signal IN1 retains a steady-state voltage level, a constant current may flow through the source resistor 130, and a constant current may flow from the first and second common nodes CN1 and CN2 to the low-voltage rail through the first and second current sources 161 and 162. Therefore, the output signal OUT and the complementary signal OUTB of the output signal may retain constant voltage levels. When the first input signal IN1 transitions from a low level to a high level, the first transistor T1 may be turned on to lower the voltage level of the first output node ON1, and the amount of current flowing into the first common node CN1 and the first capacitor 141 may be increased to raise the voltage level of the first common node CN1. At this time, when the second input signal IN2 is the reference voltage, the amount of current flowing to the second common node CN2 and the second capacitor 142 might not be changed, and the second common node CN2 may retain a constant voltage level. Therefore, the voltage level of the first output node ON1 may be sufficiently lowered to the level of the low voltage VDDL, but the voltage level of the second output node ON2 might not be sufficiently raised to the level of the high voltage VDDH. Furthermore, the peak may be formed in the complementary signal OUTB of the output signal, but no peak may be formed in the output signal OUT. In an embodiment, the gain booster 150 may change the voltage level of the second common node CN2 based on the first input signal IN1. The boosting capacitor BC may raise the voltage level of the second common node CN2 when the first input signal IN1 transitions to a high level. When the voltage level of the second common node CN2 is raised, a voltage difference between the gate and source of the second transistor T2 may decrease, and the amount of current flowing through the second transistor T2 may decrease. Therefore, the voltage level of the second output node ON2 may be sufficiently raised to the level of the high voltage VDDH, and the peak may be formed in the output signal OUT generated from the second output node ON2. The amplification circuit 100 may include the gain booster 150 to increase the AC gain of the output signal OUT, such that the AC gain of the complementary signal OUTB of the output signal and the AC gain of the output signal OUT can be balanced with each other.

When the first input signal IN1 transitions from a high level to a low level, the first transistor T1 may be turned off to raise the voltage level of the first output node ON1, and the amount of current flowing into the first common node CN1 and the first capacitor 141 may be decreased to lower the voltage level of the first common node CN1. At this time, when the second input signal IN2 is the reference voltage, the amount of current flowing into the second common node CN2 and the second capacitor 142 might not be changed, and the second common node CN2 may retain a constant voltage level. Therefore, the voltage level of the first output node ON1 may be sufficiently raised to the level of the high voltage VDDH, but the voltage level of the second output node ON2 might not be sufficiently lowered to the level of the low voltage VDDL. Furthermore, a peak may be formed in the complementary signal OUTB of the output signal, but no peak may be formed in the output signal OUT. In an embodiment, the gain booster 150 may change the voltage level of the second common node CN2 based on the first input signal IN1. The boosting capacitor BC may lower the voltage level of the second common node CN2 when the first input signal IN1 transitions to a low level. When the voltage level of the second common node CN2 is lowered, a voltage difference between the gate and source of the second transistor T2 may increase, and the amount of current flowing through the second transistor T2 may increase. Therefore, the voltage level of the second output node ON2 may be sufficiently lowered to the level of the low voltage VDDL, and a peak may be formed in the output signal OUT generated from the second output node ON2. The amplification circuit 100 may include the gain booster 150 to increase the AC gain of the output signal OUT, such that the AC gain of the complementary signal OUTB of the output signal and the AC gain of the output signal OUT can be balanced with each other.

Figure 2:
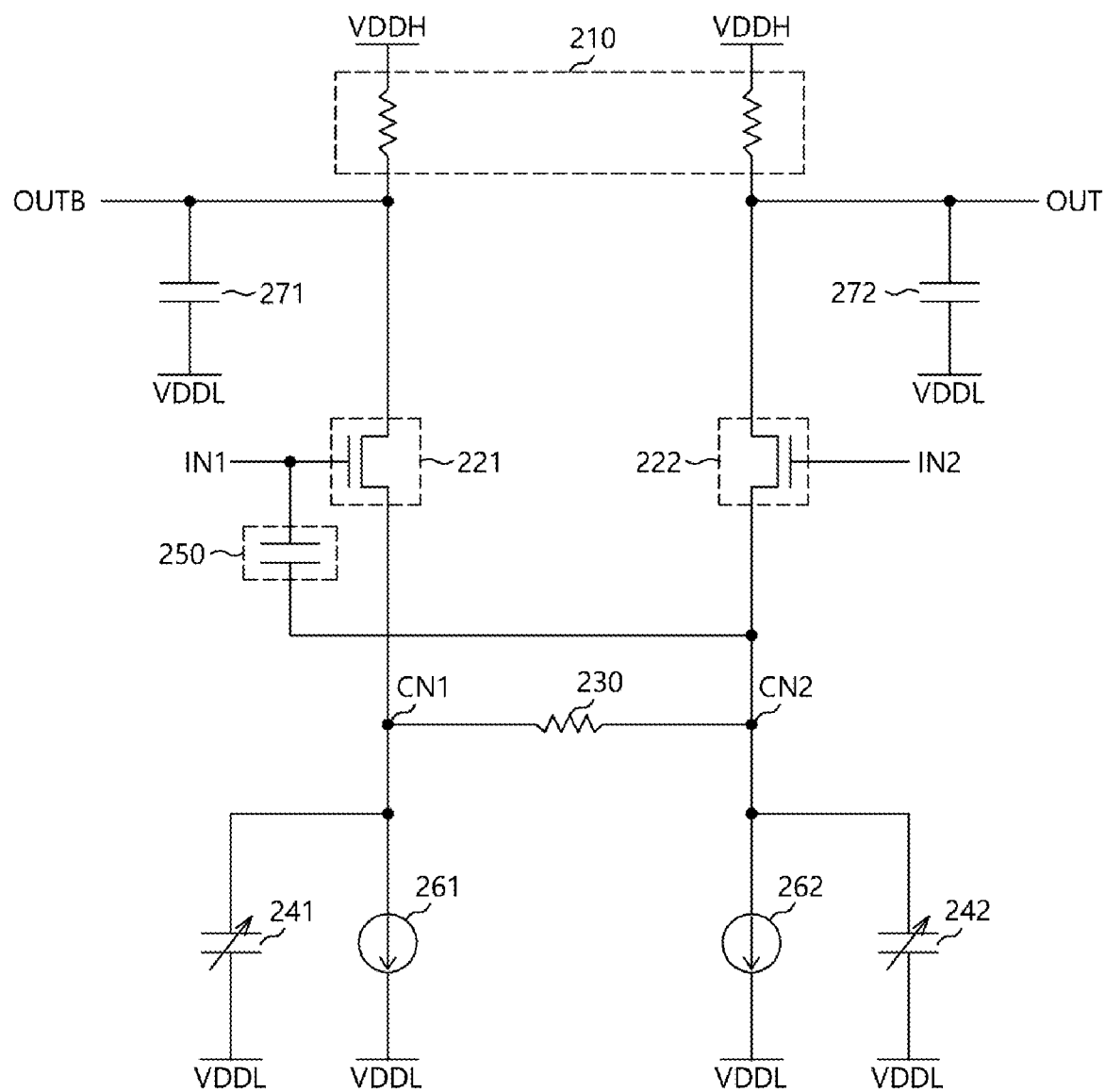
FIG. 2 illustrates the configuration of an amplification circuit in accordance with an embodiment.

FIG. 2 illustrates the configuration of an amplification circuit 200 in accordance with an embodiment. In FIG. 2, the amplification circuit 200 may receive a high voltage VDDH through a high-voltage rail, receive a low voltage VDDL through a low-voltage rail, and perform a differential amplification operation. The amplification circuit 200 may output an output signal OUT and a complementary signal OUTB of the output signal by differentially amplifying first and second input signals IN1 and IN2. The amplification circuit 200 may include a load circuit 210, a first input circuit 221, a second input circuit 222, a source resistor 230, a first programmable capacitor 241, a second programmable capacitor 242 and a gain booster 250. The amplification circuit 200 may further include a first current source 261, a second current source 262, a first load capacitor 271 and a second load capacitor 272. In FIG. 2, the same or similar components as or to those illustrated in FIG. 1 are represented by like reference numerals, and the duplicated descriptions of the same components will be omitted herein.

In FIG. 2, the first programmable capacitor 241 may be coupled between the first common node CN1 and the low-voltage rail. The second programmable capacitor 242 may be coupled between the second common node CN2 and the low-voltage rail. The first and second programmable capacitors 241 and 242 may have variable capacitance. The second programmable capacitor 242 may have the same capacitance as or different capacitance from the first programmable capacitor 241. For example, when the amplification circuit 200 receives differential signals as the first and second input signals IN1 and IN2, the first and second programmable capacitors 241 and 242 may be controlled to have the same capacitance. When the amplification circuit 200 receives a single-ended signal and a reference voltage as the first and second input signals IN1 and IN2, the first and second programmable capacitors 241 and 242 may be controlled to have different capacitances from each other. For example, the higher the capacitance of the first programmable capacitor 241, the lower the capacitance of the second programmable capacitor 242. Increasing the capacitance of the first programmable capacitor 241 and decreasing the capacitance of the second programmable capacitor 242 may increase the magnitude and bandwidth of the AC gain of the amplification circuit 200.

Figure 3:
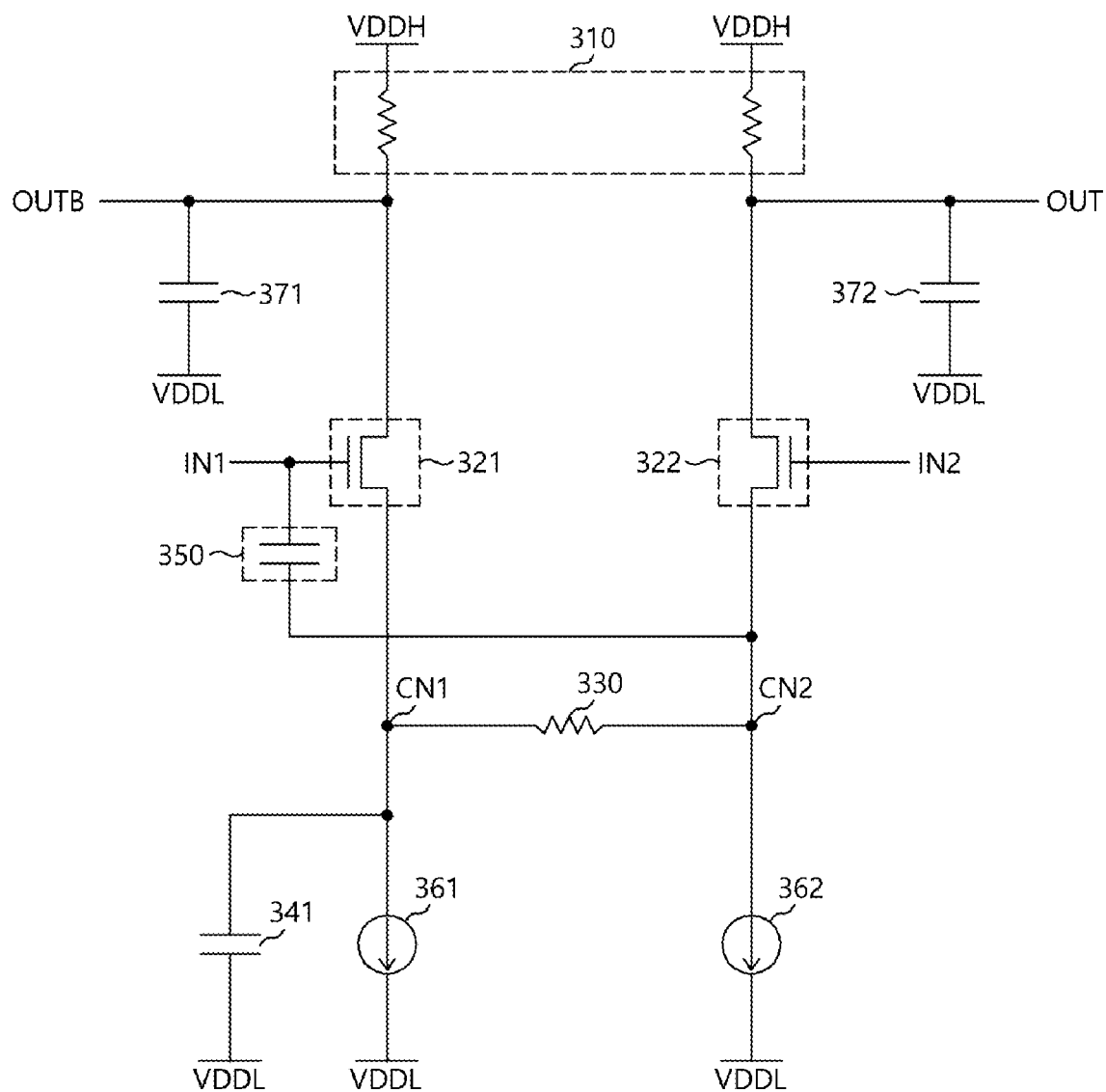
FIG. 3 illustrates the configuration of an amplification circuit in accordance with an embodiment.

FIG. 3 illustrates the configuration of an amplification circuit 300 in accordance with an embodiment. In FIG. 3, the amplification circuit 300 may receive a high voltage VDDH through a high-voltage rail, receive a low voltage VDDL through a low-voltage rail, and perform a differential amplification operation. The amplification circuit 300 may output an output signal OUT and a complementary signal OUTB of the output signal by differentially amplifying first and second input signals IN1 and IN2. The amplification circuit 300 may include a load circuit 310, a first input circuit 321, a second input circuit 322, a source resistor 330, a first capacitor 341 and a gain booster 350. The amplification circuit 300 may further include a first current source 361, a second current source 362, a first load capacitor 371 and a second load capacitor 372. In FIG. 3, the same or similar components as or to those illustrated in FIG. 1 are represented by like reference numerals, and the duplicated descriptions of the same components will be omitted herein.

In FIG. 3, the amplification circuit 300 may include the first capacitor 341 coupled between the first common node CN1 and the low-voltage rail, like the amplification circuit 100 illustrated in FIG. 1, but not include a component corresponding to the second capacitor 142 coupled between the second common node CN2 and the low-voltage rail. The first capacitor 341 may be configured as a programmable capacitor having variable capacitance. Since the amplification circuit 300 does not include a capacitor coupled between the second common node CN2 and the low-voltage rail, the magnitude and bandwidth of the AC gain of the amplification circuit 300 may be increased.

Figure 4A:
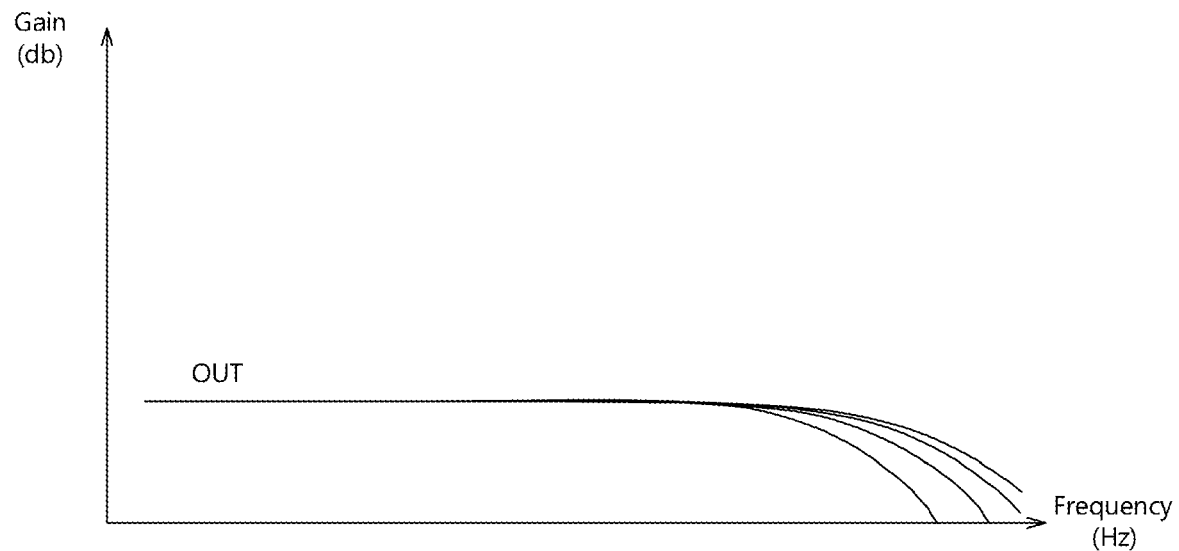
FIGS. 4A and 4B are graphs illustrating a gain of the amplification circuit in accordance with an embodiment, with respect to frequency.
Figure 4A:
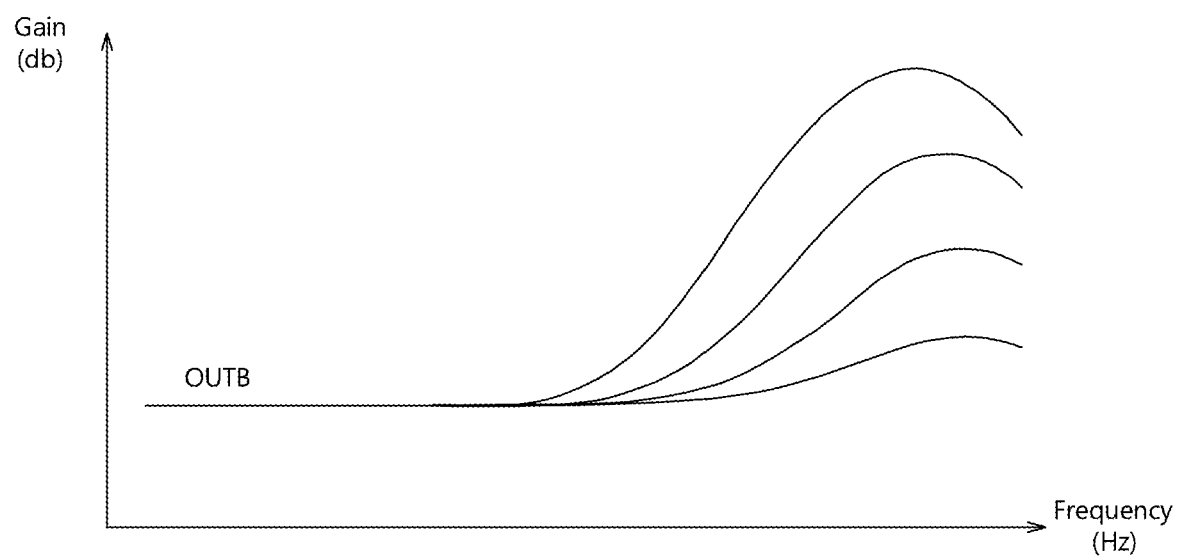
Figure 4B:
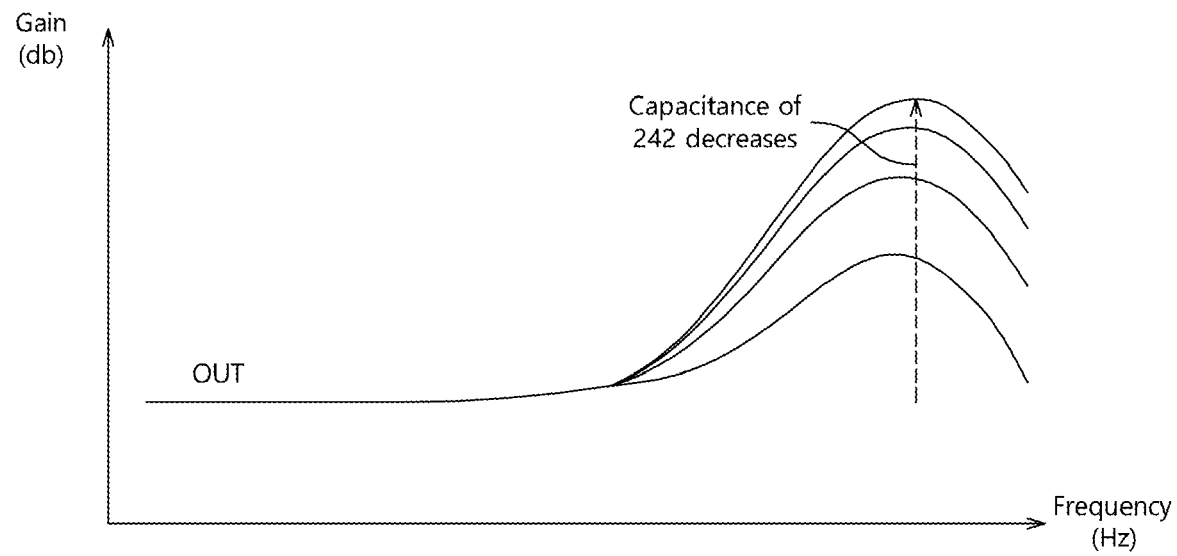
Figure 4B:
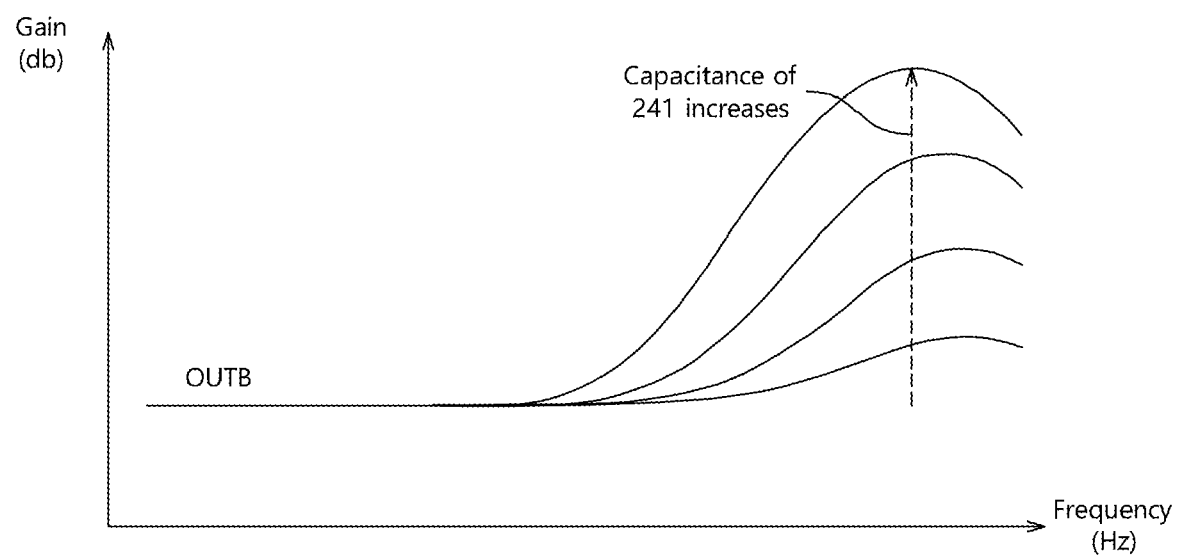

FIGS. 4A and 4B are graphs illustrating the AC gain of the amplification circuit in accordance with an embodiment, with respect to frequency. In FIGS. 4A and 4B, the horizontal axis may indicate the frequency (Hz), and the vertical axis may indicate the magnitude of the AC gain. The magnitude of the AC gain may be expressed as decibel (db). As illustrated in FIGS. 4A and 4B, the amplification circuit 100, 200 or 300 may have a constant AC gain at a relatively low frequency, but have a variable AC gain at a relatively high frequency.

Referring to FIGS. 1 and 4A, when the amplification circuit 100 receives a single-ended signal and does not include the gain booster 150, the AC gain of the complementary signal OUTB of the output signal outputted from the first output node ON1 may increase at a relatively high frequency, but the AC gain of the output signal outputted from the second output node ON2 may decrease at a relatively high frequency. Therefore, a peak may be formed in the complementary signal OUTB of the output signal outputted from the first output node ON1 based on the first input signal IN1. However, since the voltage level of the second input signal IN2 corresponding to the reference voltage is not changed, no peak may be formed in the output signal OUT outputted from the second output node ON2. Therefore, as the frequency increases, an imbalance may occur between the AC gains for the output signal OUT and the complementary signal OUTB of the output signal. Furthermore, when the capacitances of the first and second capacitors 141 and 142 are increased, the magnitude and bandwidth of the AC gain for generating the complementary signal OUTB of the output signal may be increased as illustrated in FIG. 4A. However, the magnitude and bandwidth of the AC gain for generating the output signal OUT may be decreased.

When the amplification circuit 100 includes the gain booster 150, the AC gain for generating the output signal OUT may be increased as illustrated in FIG. 4B, even though the reference voltage is inputted as the second input signal IN2. The gain booster 150 may change the voltage level of the second common node CN2 based on the first input signal IN1, thereby forming a peak in the output signal OUT outputted from the second output node ON2. At this time, the higher the capacitance of the first capacitor 141, the larger the magnitude and bandwidth of the AC gain for generating the complementary signal OUTB of the output signal. On the other hand, the higher the capacitance of the second capacitor 142, the smaller the magnitude and bandwidth of the AC gain for generating the output signal OUT. Thus, as the capacitance of the first programmable capacitor 241 is increased, the capacitance of the second programmable capacitor 242 may be decreased to increase the AC gain of the amplification circuit 200, as illustrated in FIG. 2. Furthermore, as illustrated in FIG. 3, the capacitor coupled between the second common node CN2 and the low-voltage rail may be removed to increase the AC gain of the amplification circuit 300.

Figure 5:
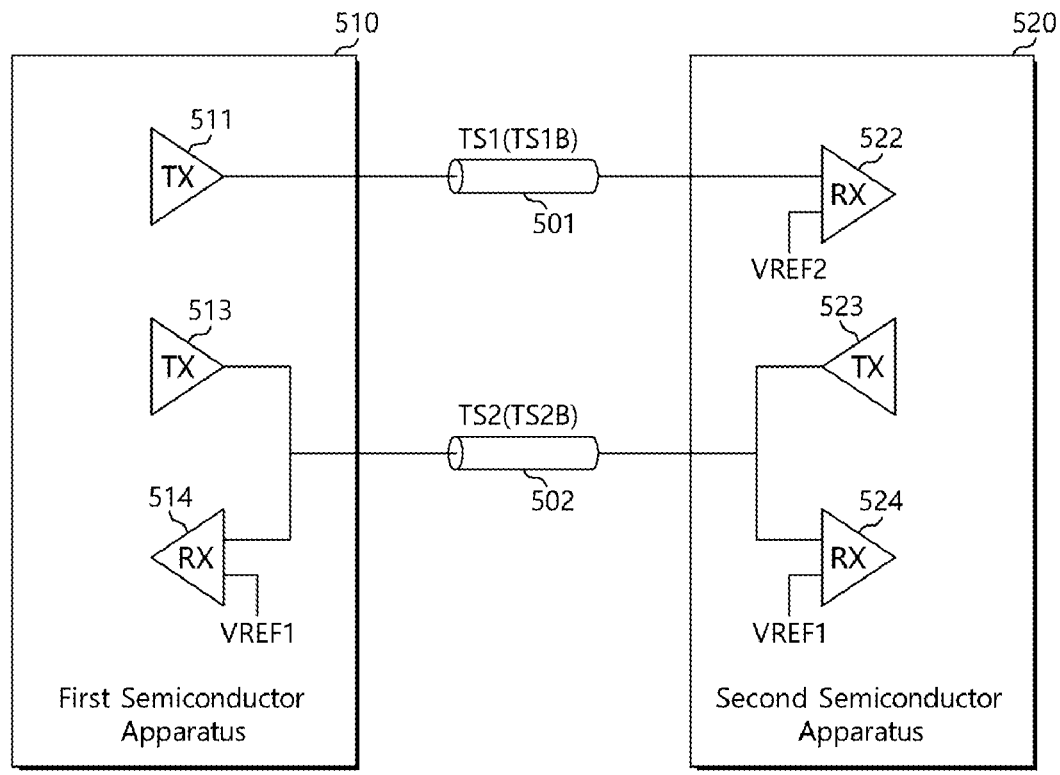
FIG. 5 illustrates the configuration of a semiconductor system in accordance with an embodiment.

FIG. 5 illustrates the configuration of a semiconductor system 5 in accordance with an embodiment. In FIG. 5, the semiconductor system 5 may include first and second semiconductor apparatuses 510 and 520. The first semiconductor apparatus 510 may provide various control signals required for an operation of the second semiconductor apparatus 520. The first semiconductor apparatus 510 may include various types of host devices. For example, the first semiconductor apparatus 510 may include a host device such as a central processing circuit (CPU), graphic processing circuit (GPU), multi-media processor (MMP), digital signal processor, application processor or memory controller. The second semiconductor apparatus 520 may be a memory device, for example, and the memory device may include a volatile memory and a nonvolatile memory. Examples of the volatile memory may include an SRAM (Static RAM), DRAM (Dynamic RAM) and SDRAM (Synchronous DRAM), and examples of the nonvolatile memory may include a ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), FRAM (Ferroelectric RAM) and the like.

The second semiconductor apparatus 520 may be coupled to the first semiconductor apparatus 510 through first and second buses 501 and 502. The first and second buses 501 and 502 may be signal transmission paths, links or channels for transmitting signals. The first bus 501 may be a unidirectional bus. The first semiconductor apparatus 510 may transmit a first signal TS1 to the second semiconductor apparatus 520 through the first bus 501, and the second semiconductor apparatus 520 may be coupled to the first bus 501 to receive the first signal TS1 transmitted from the first semiconductor apparatus 510. The first signal TS1 may include control signals such as a command signal, clock signal and address signal, for example. The second bus 502 may include a bidirectional bus. The first semiconductor apparatus 510 may transmit a second signal TS2 to the second semiconductor apparatus 520 through the second bus 502, or receive the second signal TS2 transmitted from the second semiconductor apparatus 520 through the second bus 502. The second semiconductor apparatus 520 may transmit the second signal TS2 to the first semiconductor apparatus 510 through the second bus 502, or receive the second signal TS2 transmitted from the first semiconductor apparatus 510 through the second bus 502. The second signal TS2 may include data, for example. In an embodiment, the first and second signals TS1 and TS2 may be transmitted as a differential signal pair with complementary signals TS1B and TS2B through the first and second buses 501 and 502, respectively. In an embodiment, the first and second signals TS1 and TS2 may be transmitted as single-ended signals through the first and second buses 501 and 502, respectively.

The first semiconductor apparatus 510 may include a first transmitting (TX) circuit 511, a second transmitting (TX) circuit 513 and a receiving (RX) circuit 514. The first transmitting circuit 511 may be coupled to the first bus 501, and drive the first bus 501 to transmit the first signal TS1 to the second semiconductor apparatus 520, based on an internal signal of the first semiconductor apparatus 510. The second transmitting circuit 513 may be coupled to the second bus 502, and drive the second bus 502 to transmit the second signal TS2 to the second semiconductor apparatus 520, based on the internal signal of the first semiconductor apparatus 510. The receiving circuit 514 may be coupled to the second bus 502, and receive the second signal TS2 transmitted from the second semiconductor apparatus 520 through the second bus 502. The receiving circuit 514 may generate the internal signal used in the first semiconductor apparatus 510 by differentially amplifying the second signal TS2 transmitted through the second bus 502. When a differential signal pair is transmitted through the second bus 502, the receiving circuit 514 may generate the internal signal by differentially amplifying the second signal TS2 and the complementary signal TS2B of the second signal. When a single-ended signal is transmitted through the second bus 502, the receiving circuit 514 may generate the internal signal by differentially amplifying the second signal TS2 and a first reference voltage VREF1. The first reference voltage VREF1 may have a voltage level corresponding to the middle of the range in which the second signal TS2 swings. The receiving circuit 514 may include the amplification circuits 100 to 300 illustrated in FIGS. 1 to 3.

The second semiconductor apparatus 520 may include a first receiving (RX) circuit 522, a transmitting (TX) circuit 523 and a second receiving (RX) circuit 524. The first receiving circuit 522 may be coupled to the first bus 501, and receive the first signal TS1 transmitted from the first semiconductor apparatus 510 through the first bus 501. The first receiving circuit 522 may generate an internal signal used in the second semiconductor apparatus 520 by differentially amplifying the first signal TS1 transmitted through the first bus 501. When a differential signal pair is transmitted through the first bus 501, the first receiving circuit 522 may generate the internal signal by differentially amplifying the first signal TS1 and the complementary signal TS1B of the first signal. When a single-ended signal is transmitted through the first bus 501, the first receiving circuit 522 may generate the internal signal by differentially amplifying the first signal TS1 and a second reference voltage VREF2. The second reference voltage VREF2 may have a voltage level corresponding to the middle of the range in which the first signal TS1 swings. The transmitting circuit 523 may be coupled to the second bus 502, and drive the second bus 502 to transmit the second signal TS2 to the first semiconductor apparatus 510, based on the internal signal of the second semiconductor apparatus 520. The second receiving circuit 524 may be coupled to the second bus 502, and receive the second signal TS2 transmitted from the first semiconductor apparatus 510 through the second bus 502. The second receiving circuit 524 may generate the internal signal used in the second semiconductor apparatus 520 by differentially amplifying the second signal TS2 transmitted through the second bus 502. When a differential signal pair is transmitted through the second bus 502, the second receiving circuit 524 may generate the internal signal by differentially amplifying the second signal TS2 and the complementary signal TS2B of the second signal. When a single-ended signal is transmitted through the second bus 502, the second receiving circuit 524 may generate the internal signal by differentially amplifying the second signal TS2 and the first reference voltage VREF1. The first and second receiving circuits 522 and 524 may include the amplification circuits 100 to 300 illustrated in FIGS. 1 to 3.

Figure 6:
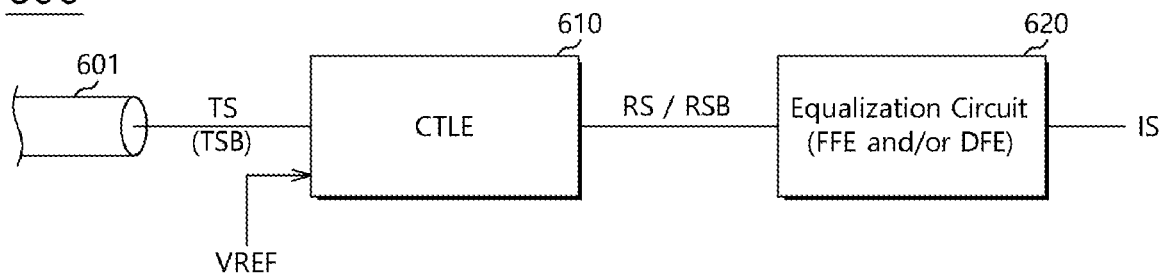
FIG. 6 illustrates the configuration of a receiving circuit in accordance with an embodiment.

FIG. 6 illustrates the configuration of a receiving circuit 600 in accordance with an embodiment. The receiving circuit 600 may be applied to the receiving circuit 514, the first receiving circuit 522 and the second receiving circuit 524 which are illustrated in FIG. 5. The receiving circuit 600 may include a continuous time linear equalizer (CTLE) 610 and an equalization circuit 620. The receiving circuit 600 may be coupled to an external bus 601 or a channel, and receive a transmit (Tx) signal TS transmitted through the external bus 601. The receiving circuit 600 may generate an internal signal IS from the Tx signal TS. Inter-symbol interference (ISI) may occur in the Tx signal TS due to a high frequency loss, reflection or cross-talk of the external bus 601 or the channel. Thus, a previously transmitted signal may cause precursor interference in a signal to be subsequently transmitted. The CTLE 610 and the equalization circuit 620 may be used to minimize the precursor interference.

The CTLE 610 may be coupled to the external bus 601, and receive the Tx signal TS transmitted through the external bus 601. The CTLE 610 may generate a pair of receive (Rx) signals RS and RSB by differentially amplifying the Tx signal TS. The Rx signal pair may include the Rx signal RS and a complementary signal RSB of the Rx signal. The CTLE 610 may accurately amplify a level transition of the Tx signal TS by increasing an AC gain instead of decreasing a DC gain, in order to generate the Rx signal RS. The Tx signal TS may be transmitted as a differential signal pair with the complementary signal TSB, and transmitted as a single-ended signal. The CTLE 610 may generate the Rx signal RS by differentially amplifying the Tx signal TS and the complementary signal TSB, and generate the Rx signal RS by differentially amplifying the Tx signal TS transmitted as the single-ended signal and the reference voltage VREF. The amplification circuits 100 to 300 illustrated in FIGS. 1 to 3 may be applied as the CTLE 610.

The equalization circuit 620 may receive the Rx signal pair RS and RSB, and generate the internal signal IS. The equalization circuit 620 may generate the internal signal IS by removing precursor interference which may occur in the Rx signal pair RS and RSB. The equalization circuit 620 may be implemented in various manners depending on the characteristics of a semiconductor apparatus to which the receiving circuit 600 is applied. The equalization circuit 620 may include one or more of a decision feedback equalization circuit and a feed forward equalization circuit.

While various embodiments have been described above, it will be understood to those skilled in the art that the embodiments described are examples only. Accordingly, the amplification circuit described herein should not be limited based on the described embodiments.

What is claimed is:

1. An amplification circuit comprising:
    a load circuit coupled between a high-voltage rail and first and second output nodes;
    a first input circuit coupled between the first output node and a first common node, and configured to change a voltage level of the first output node based on a first input signal;
    a second input circuit coupled between the second output node and a second common node, and configured to change a voltage level of the second output node based on a second input signal, and output an output signal through the second output node;
    a source resistor coupled between the first and second common nodes;
    a first capacitor coupled between the first common node and a low-voltage rail;
    a second capacitor coupled between the second common node and the low- voltage rail; and
    a gain booster configured to receive the first input signal and change a voltage level of the second common node.

2. The amplification circuit according to claim 1, wherein the load circuit comprises:
    a first load resistor coupled between the high-voltage rail and the first output node; and
    a second load resistor coupled between the high-voltage rail and the second output node.

3. The amplification circuit according to claim 1, wherein the first input circuit comprises a first transistor having a gate configured to receive the first input signal, a drain coupled to the first output node, and a source coupled to the first common node.

4. The amplification circuit according to claim 1, wherein the second input circuit comprises a second transistor having a gate configured to receive the second input signal, a drain coupled to the second output node, and a source coupled to the second common node.

5. The amplification circuit according to claim 1, wherein the source resistor comprises a programmable resistor having a variable resistance value.

6. The amplification circuit according to claim 1, wherein the gain booster comprises a boosting capacitor having one terminal configured to receive the first input signal and the other terminal coupled to the second common node.

7. The amplification circuit according to claim 1, wherein the first input signal comprises a single-ended signal, and the second input signal comprises a reference voltage having a voltage level corresponding to the middle of the range in which the first input signal swings.

8. An amplification circuit comprising:
    a load circuit coupled between a high-voltage rail and first and second output nodes;
    a first input circuit coupled between the first output node and a first common node, and configured to change a voltage level of the first output node based on a first input signal;
    a second input circuit coupled between the second output node and a second common node, and configured to change a voltage level of the second output node based on a second input signal, and output an output signal through the second output node;
    a source resistor coupled between the first and second common nodes;
    a first programmable capacitor coupled between the first common node and a low-voltage rail;
    a second programmable capacitor coupled between the second common node and the low-voltage rail; and
    a gain booster configured to receive the first input signal and change a voltage level of the second common node.

9. The amplification circuit according to claim 8, wherein the load circuit comprises:
    a first load resistor coupled between the high-voltage rail and the first output node; and
    a second load resistor coupled between the high-voltage rail and the second output node.

10. The amplification circuit according to claim 8, wherein the first input circuit comprises a first transistor having a gate configured to receive the first input signal, a drain coupled to the first output node, and a source coupled to the first common node.

11. The amplification circuit according to claim 8, wherein the second input circuit comprises a second transistor having a gate configured to receive the second input signal, a drain coupled to the second output node, and a source coupled to the second common node.

12. The amplification circuit according to claim 8, wherein the source resistor comprises a programmable resistor having a variable resistance value.

13. The amplification circuit according to claim 8, wherein the first programmable capacitor has different capacitance from the second programmable capacitor.

14. The amplification circuit according to claim 8, wherein as the capacitance of the first programmable capacitor increases, the capacitance of the second programmable capacitor decreases.

15. The amplification circuit according to claim 8, wherein the gain booster comprises a boosting capacitor having one terminal configured to receive the first input signal and the other terminal coupled to the second common node.

16. The amplification circuit according to claim 8, wherein the first input signal comprises a single-ended signal, and the second input signal comprises a reference voltage having a voltage level corresponding to the middle of the range in which the first input signal swings.

17. An amplification circuit comprising:
a load circuit coupled between a high-voltage rail and first and second output nodes;
a first input circuit coupled between the first output node and a first common node, and configured to change a voltage level of the first output node based on a first input signal;
a second input circuit coupled between the second output node and a second common node, and configured to change a voltage level of the second output node based on a second input signal, and output an output signal through the second output node;
a source resistor coupled between the first and second common nodes;
a capacitor coupled between the first common node and a low-voltage rail, the capacitor comprising a programmable capacitor having variable capacitance; and
a gain booster configured to receive the first input signal and change a voltage level of the second common node.

18. The amplification circuit according to claim 17, wherein the load circuit comprises:
a first load resistor coupled between the high-voltage rail and the first output node; and
a second load resistor coupled between the high-voltage rail and the second output node.

19. The amplification circuit according to claim 17, wherein the first input circuit comprises a first transistor having a gate configured to receive the first input signal, a drain coupled to the first output node, and a source coupled to the first common node.

20. The amplification circuit according to claim 17, wherein the second input circuit comprises a second transistor having a gate configured to receive the second input signal, a drain coupled to the second output node, and a source coupled to the second common node.

21. The amplification circuit according to claim 17, wherein the source resistor comprises a programmable resistor having a variable resistance value.

22. The amplification circuit according to claim 17, wherein the gain booster comprises a boosting capacitor having one terminal configured to receive the first input signal and the other terminal coupled to the second common node.

23. The amplification circuit according to claim 17, wherein the first input signal comprises a single-ended signal, and the second input signal comprises a reference voltage having a voltage level corresponding to the middle of the range in which the first input signal swings.

24. An amplification circuit comprising:
a load circuit coupled between a high-voltage rail and first and second output nodes;
a first transistor having a gate configured to receive a first input signal, a drain coupled to the first output node, and a source coupled to a first common node:
a second transistor having a gate configured to receive a second input signal, a drain coupled to the second output node, and a source coupled to a second common node;
a source resistor coupled between the first and second common nodes;
a first capacitor coupled between the first common node and a low-voltage rail:
a second capacitor coupled between the second common node and the low-voltage rail; and
a gain booster configured to receive the first input signal and change a voltage level of the second common node.

* * * * *

UNITED STATES PATENT AND TRADEMARK OFFICE
CERTIFICATE OF CORRECTION

Page 1 of 1

PATENT NO. : 10,778,163 B2
APPLICATION NO. : 16/228110
DATED : September 15, 2020
INVENTOR(S) : Hyun Bae Lee It is certified that error appears in the above-identified patent and that said Letters Patent is hereby corrected as shown below:

On the Title Page

Item (71) Applicant:
Replace "SK hynix Inc., Incheon-si Gyeonggi-do (KR)" with --SK hynix Inc., Icheon-si Gyeonggi-do (KR)--

Item (72) Inventor:
Replace "Hyun Bae LEE, Icheon-si (KR)" with --Hyun Bae LEE, Icheon-si Gyeonggi-do (KR)--

Signed and Sealed this
Twenty-seventh Day of October, 2020

Andrei Iancu
*Director of the United States Patent and Trademark Office*